(12) United States Patent
Seko

(10) Patent No.: US 11,711,979 B2
(45) Date of Patent: Jul. 25, 2023

(54) THERMOELECTRIC CONVERSION ELEMENT AND MANUFACTURING METHOD FOR THERMOELECTRIC CONVERSION ELEMENT

(71) Applicant: Tianma Japan, Ltd., Kanagawa (JP)

(72) Inventor: Nobuya Seko, Kanagawa (JP)

(73) Assignee: TIANMA JAPAN. LTD., Kanagawa (JP)

( * ) Notice: Subject to any disclaimer, the term of this patent is extended or adjusted under 35 U.S.C. 154(b) by 0 days.

(21) Appl. No.: 18/073,275

(22) Filed: Dec. 1, 2022

(65) Prior Publication Data

US 2023/0180612 A1 Jun. 8, 2023

(30) Foreign Application Priority Data

Dec. 8, 2021 (JP) .................................. 2021-199323
Jul. 15, 2022 (JP) .................................. 2022-114259

(51) Int. Cl.
*H10N 10/817* (2023.01)
*H10N 10/01* (2023.01)
*H10N 10/17* (2023.01)

(52) U.S. Cl.
CPC ........... *H10N 10/817* (2023.02); *H10N 10/01* (2023.02); *H10N 10/17* (2023.02)

(58) Field of Classification Search
CPC ....... H10N 10/817; H10N 10/17; H10N 10/01
See application file for complete search history.

(56) References Cited

FOREIGN PATENT DOCUMENTS

| JP | 2008-034751 A |   | 2/2008 |
|---|---|---|---|
| JP | 2011044621 A | * | 3/2011 |
| JP | 6513476 B2 |   | 5/2019 |

OTHER PUBLICATIONS

Inaba et al., JP2011044621 A, English Machine Translation, pp. 1-9. (Year: 2011).*

* cited by examiner

*Primary Examiner* — Tae-Sik Kang
(74) *Attorney, Agent, or Firm* — Sughrue Mion, PLLC

(57) ABSTRACT

A thermoelectric conversion element includes a substrate, a thermoelectric conversion layer disposed on a first main surface of the substrate, an insulating layer covering the thermoelectric conversion layer, a first electrode disposed on the insulating layer and connecting to a first main surface of the thermoelectric conversion layer via a first contact hole of insulating layer, and a second electrode disposed on the insulating layer and connecting to the first main surface of the thermoelectric conversion layer via a second contact hole of the insulating layer. At least a portion of the first electrode is formed from a material that has a work function that is different from a work function of a material forming the second electrode.

10 Claims, 14 Drawing Sheets

THERMOELECTRIC CONVERSION ELEMENT AND MANUFACTURING METHOD FOR THERMOELECTRIC CONVERSION ELEMENT

CROSS-REFERENCE TO RELATED APPLICATION

This application claims the benefit of Japanese Patent Application No. 2021-199323, filed on Dec. 8, 2021, and Japanese Patent Application No. 2022-114259, filed on Jul. 15, 2022, of which the entirety of the disclosures is incorporated by reference herein.

FIELD

The present disclosure relates generally to a thermoelectric conversion element and a manufacturing method for thermoelectric conversion element.

BACKGROUND

In the related art, thermoelectric conversion elements are known that generate thermoelectromotive force between two electrodes due to temperature differences. For example, Japanese Patent No. 6513476 describes a thermoelectric conversion element including a thin film-like thermoelectric conversion material layer, a first electrode provided on one main surface of the thermoelectric conversion material layer, and a second electrode provided at a location, different than that of the first electrode, in an in-plane direction of the one main surface of the thermoelectric conversion material layer. In Japanese Patent No. 6513476, the work function of the material constituting the first electrode and the work function of the material constituting the second electrode are different.

With the thermoelectric conversion element of Japanese Patent No. 6513476, the short-circuit current can be increased by narrowing the spacing between the first electrode and the second electrode and, as such, a miniaturized structure is desirable. However, several problems may arise when miniaturizing the thermoelectric conversion element of Japanese Patent No. 6513476 by photolithography and etching. For example, when forming the first electrode on the one main surface of the thermoelectric conversion material layer, the material constituting the thermoelectric conversion material layer and the material constituting the first electrode are different, and the thermoelectric conversion material layer and the first electrode that have different electrode potentials are in a conducting state. As such, in the etching solution, a galvanic cell is formed between the thermoelectric conversion material layer and the first electrode. A galvanic cell is an electrochemical cell that uses chemical reaction to produce electrical current. This galvanic cell generates current between the thermoelectric conversion material layer and the first electrode due to the potential difference between the thermoelectric conversion material layer and the first electrode. This current may lead to dissolving of the thermoelectric conversion material layer, abnormal dissolving of the material constituting the first electrode, and the like. Likewise, also when forming the second electrode on the one main surface of the thermoelectric conversion material layer on which the first electrode is formed, in the etching solution, current flows between the thermoelectric conversion material layer, the first electrode, and the second electrode, which may lead to dissolving of the thermoelectric conversion material layer and the first electrode, abnormal dissolving of the material constituting the second electrode, and the like.

SUMMARY

A thermoelectric conversion element according to a first aspect includes:
  a substrate;
  a thermoelectric conversion layer disposed on a main surface of the substrate;
  an insulating layer covering the thermoelectric conversion layer;
  a first electrode disposed on the insulating layer and connecting to a main surface of the thermoelectric conversion layer via a first contact hole of insulating layer; and
  a second electrode disposed on the insulating layer and connecting to the main surface of the thermoelectric conversion layer via a second contact hole of the insulating layer, wherein
  at least a portion of the first electrode is formed from a material that has a work function that is different from a work function of a material forming the second electrode.

Note that a configuration is possible in which the first electrode includes a first layer and a second layer,
  the first layer connects to the main surface of the thermoelectric conversion layer,
  the second layer covers the first layer such that the first layer is not exposed from the second layer, and
  the second layer and the second electrode are formed from an identical material that has a work function that is different from the work function of the material forming the first layer.

A manufacturing method for the thermoelectric conversion element according to a second aspect includes:
  forming a thermoelectric conversion layer on a substrate;
  forming an insulating layer on the thermoelectric conversion layer;
  forming, in the insulating layer, a first contact hole that exposes a main surface of the thermoelectric conversion layer;
  forming, on the insulating layer, a first electrode that connects to the main surface of the thermoelectric conversion layer via the first contact hole;
  forming, in the insulating layer on which the first electrode is formed, a second contact hole that exposes the main surface of the thermoelectric conversion layer; and
  forming, on the insulating layer, a second electrode that connects to the main surface of the thermoelectric conversion layer via the second contact hole, from a material that has a work function that is different from a work function of a material forming at least a portion of the first electrode.

Note that a configuration is possible in which the forming of the first electrode includes forming a first layer of the first electrode, and
  the forming of the second electrode includes forming a second layer of the first electrode that covers the first layer of the first electrode such that the first layer is not exposed from the second layer, the second layer being formed from a material identical to the material forming the second electrode.

It is to be understood that both the foregoing general description and the following detailed description are exemplary and explanatory and are not restrictive of this disclosure.

BRIEF DESCRIPTION OF THE DRAWINGS

A more complete understanding of this application can be obtained when the following detailed description is considered in conjunction with the following drawings, in which.

DETAILED DESCRIPTION

Hereinafter, a thermoelectric conversion element according to embodiments is described while referencing the drawings.

Embodiment 1

Figure 1:
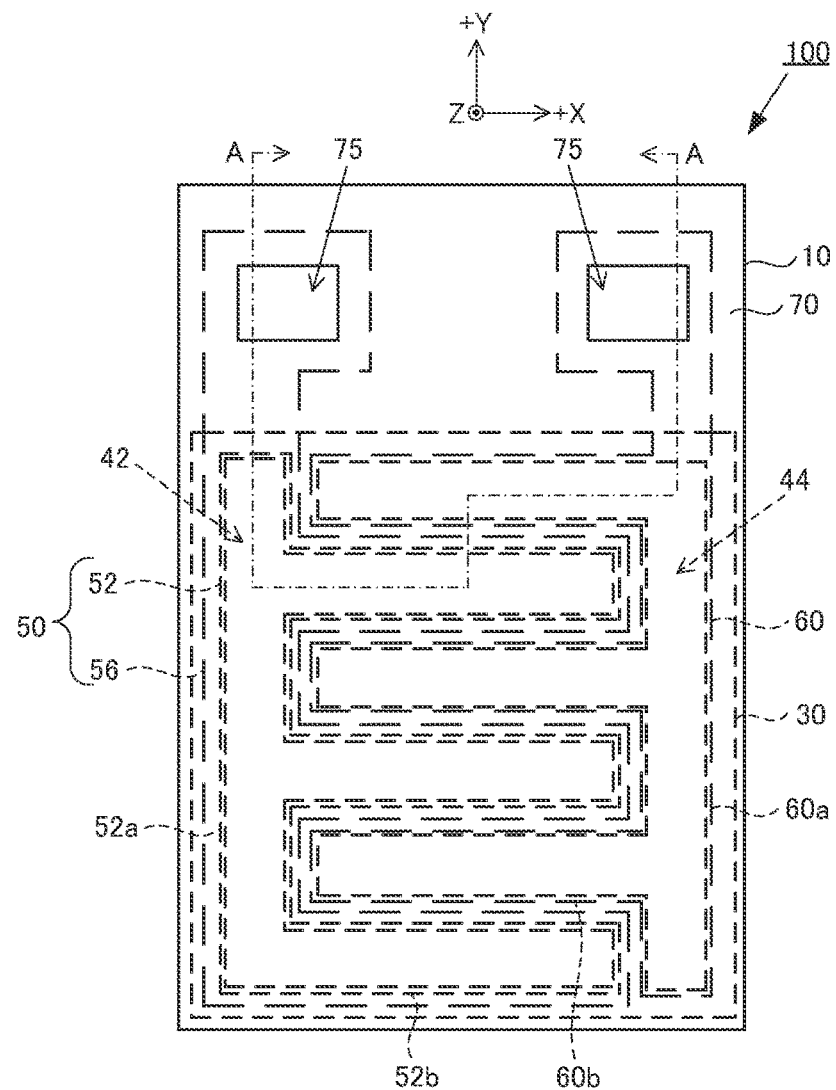
FIG. 1 is a top view illustrating a thermoelectric conversion element according to Embodiment 1.
Figure 2:
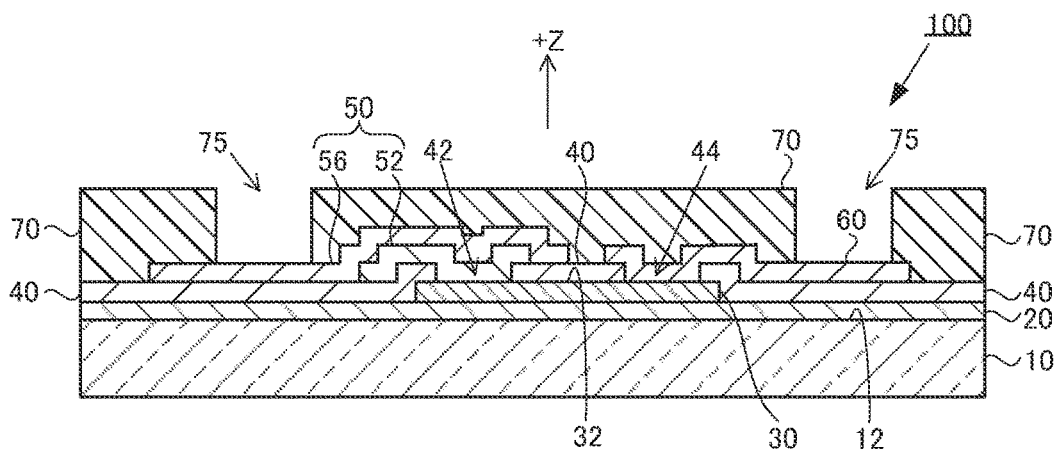
FIG. 2 is a cross-sectional view of the thermoelectric conversion element illustrated in FIG. 1, taken along line A-A.

A thermoelectric conversion element 100 according to Embodiment 1 is described while referencing FIGS. 1 to 17. As illustrated in FIGS. 1 and 2, the thermoelectric conversion element 100 includes a substrate 10, a base layer 20, a thermoelectric conversion layer 30, an insulating layer 40, a first electrode 50, a second electrode 60, and a protection layer 70. The first electrode 50 includes a first layer 52 and a second layer 56. The first layer 52 connects to a first main surface 32 of the thermoelectric conversion layer 30, and the second layer 56 covers the first layer 52 such that the first layer 52 is not exposed from the second layer 56. The second electrode 60 connects to the first main surface 32 of the thermoelectric conversion layer 30. The second layer 56 and the second electrode 60 are formed from the same material. This material has a work function different from the work function of the material forming the first layer 52. Note that, to facilitate comprehension, the base layer 20 and the insulating layer 40 are omitted from FIG. 1. The base layer 20 is sometimes omitted from the hereinafter referenced top views as well.

The thermoelectric conversion element 100 produces thermoelectromotive force due to a temperature difference in the thickness direction of the thermoelectric conversion layer 30. That is, the thermoelectric conversion element 100 converts heat energy to electrical energy. In one example, the thermoelectric conversion element 100 is used as a sensor that detects heat flux. Note that, in the present description, to facilitate comprehension, for the thermoelectric conversion element 100 of FIG. 1, the right direction (the right direction on paper) is referred to as the "+X direction", the up direction (the up direction on paper) is referred to as the "+Y direction", and the direction perpendicular to the +X direction and the +Y direction (the front direction on paper) is referred to as the "+Z direction" (the thickness direction).

In one example, the substrate 10 of the thermoelectric conversion element 100 is implemented as a flat plate-like glass substrate. In order to reduce thermal resistance in the thickness direction (the +Z direction), it is preferable that the substrate 10 is formed from a material that has high thermal conductivity.

The base layer 20 of the thermoelectric conversion element 100 is provided on a first main surface 12 of the substrate 10. In Embodiment 1, the base layer 20 is provided on an entirety of the first main surface 12. In one example, the base layer 20 is formed from silicon oxide ($SiO_x$).

The thermoelectric conversion layer 30 of the thermoelectric conversion element 100 is provided in a rectangular shape on the base layer 20. The thermoelectric conversion layer 30 is formed from an n-type or a p-type thermoelectric conversion material. Examples of the n-type thermoelectric conversion material include zinc oxide (ZnO) with added aluminum (Al), indium gallium zinc oxide (InGaZnO), and the like. Examples of the p-type thermoelectric conversion material include magnesium silicide ($Mg_2Si$) with added silver (Ag). In Embodiment 1, the thermoelectric conversion layer 30 is formed from indium gallium zinc oxide.

The insulating layer 40 of the thermoelectric conversion element 100 covers the thermoelectric conversion layer 30 and the base layer 20. As illustrated in FIG. 1, a comb teeth-shaped first contact hole 42 is formed in the insulating layer 40 in order to connect the first electrode 50 (the first layer 52) to the thermoelectric conversion layer 30. Additionally, a comb teeth-shaped second contact hole 44 is formed in the insulating layer 40 in order to connect the second electrode 60 to the thermoelectric conversion layer 30. In one example, the insulating layer 40 is formed from silicon oxide ($SiO_x$).

The first electrode 50 of the thermoelectric conversion element 100 is disposed on the insulating layer 40, and connects to the first main surface 32 (the main surface on the side opposite the substrate 10) of the thermoelectric conversion layer 30 via the first contact hole 42 of the insulating layer 40. The first electrode 50 includes the first layer 52 and the second layer 56.

The first layer 52 of the first electrode 50 is connected to the first main surface 32 of the thermoelectric conversion layer 30 via the first contact hole 42 of the insulating layer 40. The first layer 52 covers the opening of the first contact hole 42 such that the thermoelectric conversion layer 30, which is exposed from the insulating layer 40 at the bottom of the first contact hole 42, is not exposed from the first layer 52.

As illustrated in FIG. 1, the first layer 52 includes a first base 52a extending in the Y direction and a plurality of first comb teeth 52b extending in the +X direction from the first base 52a. That is, the first layer 52 is formed in a comb teeth shape. The first comb teeth 52b and second comb teeth 60b of the second electrode 60 (described later) are disposed facing each other in an alternating manner on the first main surface 32 of the thermoelectric conversion layer 30. In one example, the first layer 52 is formed from titanium (Ti) that has a small work function.

In Embodiment 1, the insulating layer 40 covers the thermoelectric conversion layer 30, and the first layer 52 of the first electrode 50 disposed on the insulating layer 40 connects to the first main surface 32 of the thermoelectric conversion layer 30 via the first contact hole 42 of the insulating layer 40. As such, when forming the first layer 52 by etching, the thermoelectric conversion layer 30 is not exposed from the insulating layer 40 and is not exposed to the etching solution. Due to this, galvanic cells are not formed by the first layer 52, the etching solution, and the thermoelectric conversion layer 30. As a result, with the thermoelectric conversion element 100, the first layer 52 can be formed by etching without causing damage (for example, excessive dissolving) due to galvanic effects to the first layer 52 and the thermoelectric conversion layer 30.

As illustrated in FIG. 2, the second layer 56 of the first electrode 50 covers the first layer 52 such that the first layer 52 is not exposed from the second layer 56, and is formed together with the second electrode 60 from the same material as the material forming the second electrode 60. Accordingly, the first layer 52 is not exposed to the etching solution when forming the second layer 56 by etching. Due to this, galvanic cells are not formed by the second layer 56, the etching solution, and the first layer 52. As a result, the second electrode 60 can be formed by etching without causing damage due to galvanic effects to the first layer 52 and the second layer 56. The material that forms the second layer 56 and the second electrode 60 is described later.

The second electrode 60 of the thermoelectric conversion element 100 is disposed on the insulating layer 40, and connects to the first main surface 32 of the thermoelectric conversion layer 30 via the second contact hole 44 of the insulating layer 40. The second electrode 60 and the first electrode 50 (the first layer 52) are not connected to each other, and the second electrode 60 is connected to the first main surface 32 at a location that is different from the location of the first main surface 32 where the first electrode 50 is connected. The second electrode 60 covers the opening of the second contact hole 44 such that the thermoelectric conversion layer 30, which is exposed from the insulating layer 40 at the bottom of the second contact hole 44, is not exposed from the second electrode 60.

As illustrated in FIG. 1, the second electrode 60 includes a second base 60a extending in the Y direction and a plurality of second comb teeth 60b extending in the −X direction from the second base 60a. That is, the second electrode 60 is formed in a comb teeth shape. The second comb teeth 60b and the first comb teeth 52b of the first layer 52 of the first electrode 50 are disposed facing each other in an alternating manner on the first main surface 32 of the thermoelectric conversion layer 30.

The second electrode 60 and the second layer 56 of the first electrode 50 are formed from the same material. This material has a work function that is different from the work function of the material forming the first layer 52 of the first electrode 50. In one example, the second electrode 60 and the second layer 56 of the first electrode 50 are formed from copper (Cu) that has a large work function.

In Embodiment 1, the insulating layer 40 covers the thermoelectric conversion layer 30, and the second electrode 60 disposed on the insulating layer 40 connects to the first main surface 32 of the thermoelectric conversion layer 30 via the second contact hole 44 of the insulating layer 40. As such, the thermoelectric conversion layer 30 is not exposed to the etching solution when forming the second electrode 60 by etching. Additionally, the first layer 52 of the first electrode 50 is covered by the second layer 56 that is formed together with the second electrode 60 and, as such, the first layer 52 is not exposed to the etching solution when forming the second electrode 60 (the second layer 56) by etching. Due to this, galvanic cells are not formed by the second electrode 60, the etching solution, and the thermoelectric conversion layer 30, and galvanic cells are not formed by the second electrode 60, the etching solution, and the first layer 52. As a result, in the thermoelectric conversion element 100, the second electrode 60 can be formed by etching without causing damage due to galvanic effects to the thermoelectric conversion layer 30, the first layer 52, and the second electrode 60.

With the thermoelectric conversion element 100, the first layer 52 of the first electrode 50 and the second electrode 60, for which the work functions of the forming materials differ, are connected to the first main surface 32 of the thermoelectric conversion layer 30, and thermoelectromotive force is generated due to the temperature difference in the thickness direction (the Z direction) of the thermoelectric conversion layer 30. With the thermoelectric conversion element 100, the thermoelectric conversion layer 30 and the first layer 52 are not damaged, even when the first layer 52 of the first electrode 50 is formed by etching, and the thermoelectric conversion layer 30, the first layer 52, the second layer 56, and the second electrode 60 are not damaged even when the second layer 56 of the first electrode 50 and the second electrode 60 are formed by etching. Accordingly, the thermoelectric conversion element 100 can easily be miniaturized by photolithography and etching.

The protection layer 70 of the thermoelectric conversion element 100 protects the first electrode 50, the second electrode 60, and the like. In one example, the protection layer 70 is formed from a photosensitive polyimide. Note that, terminal openings 75 are provided on the protection layer 70. The terminal openings 75 are for connecting the first electrode 50 and the second electrode 60 to an external device.

Figure 3:
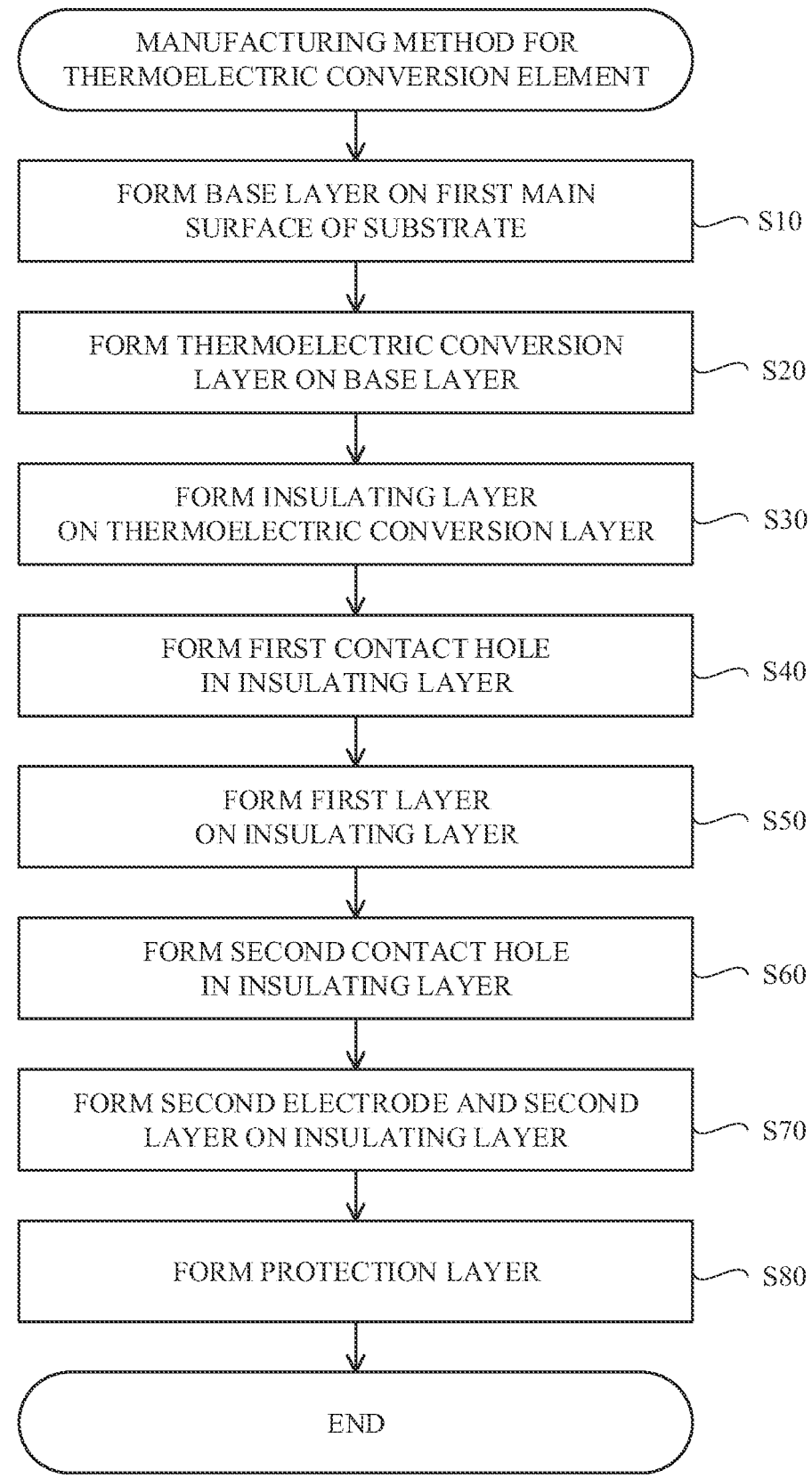
FIG. 3 is a flowchart illustrating a manufacturing method of the thermoelectric conversion element according to Embodiment 1.

Next, a manufacturing method for the thermoelectric conversion element 100 of Embodiment 1 is described while referencing FIGS. 3 to 17. FIG. 3 is a flowchart illustrating the manufacturing method for the thermoelectric conversion element 100 according to Embodiment 1. The manufacturing method for the thermoelectric conversion element 100 includes a step of forming a base layer 20 on a first main surface 12 of a substrate 10 (step S10); a step of forming a thermoelectric conversion layer 30 on the base layer 20 (on a first main surface 12 of the substrate 10) (step S20); a step of forming an insulating layer 40 on the thermoelectric conversion layer 30 (step S30); a step of forming a first contact hole 42 in the insulating layer 40 (step S40); and a step of forming, on the insulating layer 40, a first layer 52 of a first electrode 50 that connects to a first main surface 32 of the thermoelectric conversion layer 30 via the first contact hole 42 (step S50). The manufacturing method for the thermoelectric conversion element 100 further includes a step of forming, in the insulating layer 40 on which the first layer 52 of the first electrode 50 is formed, a second contact hole 44 (step S60); a step of forming, on the insulating layer 40, a second electrode 60 that connects to the first main surface 32 of the thermoelectric conversion layer 30 via a second contact hole 44 from a material that has a work function that is different from the work function of the material forming the first layer 52 of the first electrode 50 and, also, forming a second layer 56 of the first electrode 50 that covers the first layer 52 of the first electrode 50 from a material identical to the material forming the second electrode 60, such that the first layer 52 is not exposed from the second layer 56 (step S70); and a step of forming a protection layer 70 (step S80).

Figure 4:
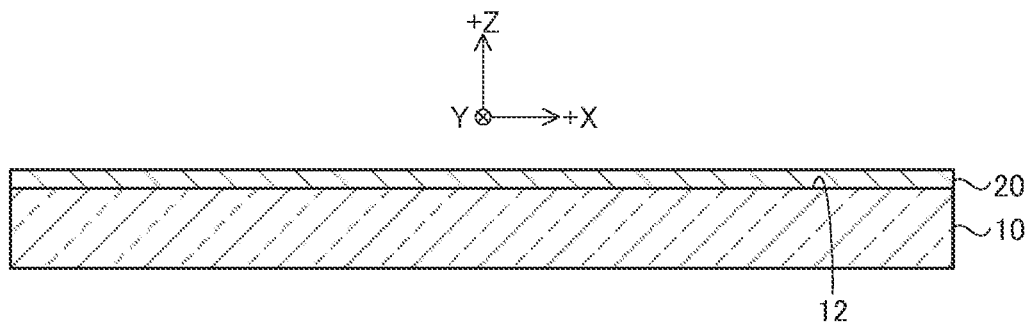
FIG. 4 is a cross-sectional view illustrating a base layer according to Embodiment 1.

In step S10, firstly, the substrate 10 is prepared. Next, as illustrated in FIG. 4, the base layer 20 is formed on the first main surface 12 of the substrate 10. In one example, the base layer 20 is formed from silicon oxide by sputtering on the entire surface of the first main surface 12.

Figure 5:
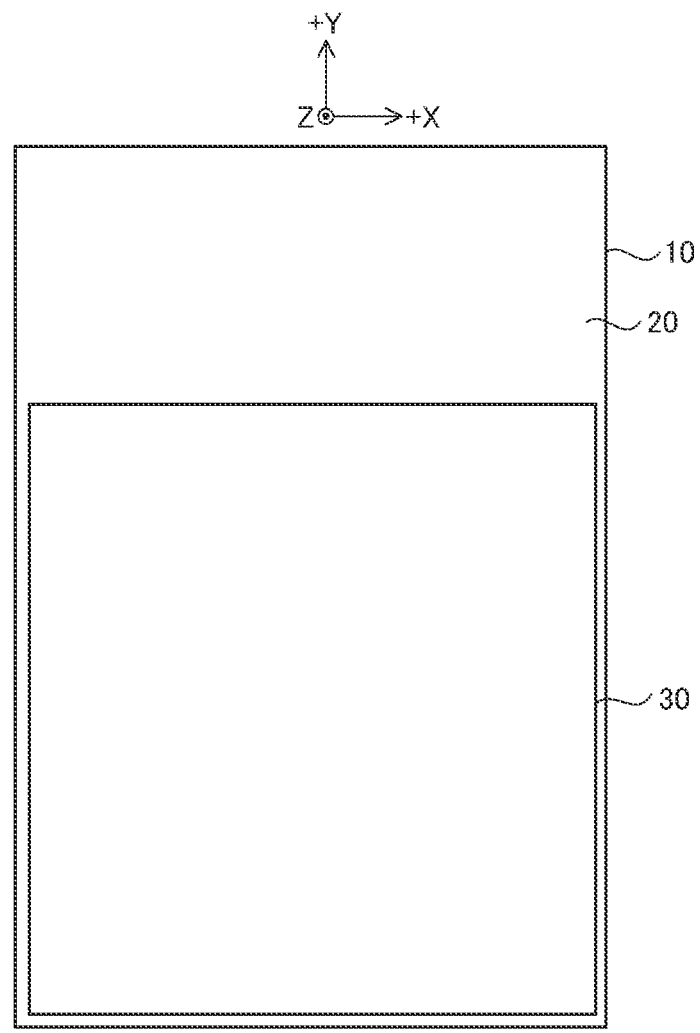
FIG. 5 is a top view illustrating a thermoelectric conversion layer according to Embodiment 1.

In step S20, as illustrated in FIG. 5, a rectangular thermoelectric conversion layer 30 is formed on the base layer 20. Specifically, firstly, a thermoelectric conversion film is formed from indium gallium zinc oxide by sputtering on the entire surface of the base layer 20. Then, the thermoelectric conversion layer 30 is formed from the thermoelectric conversion film by photolithography and etching.

Figure 6:
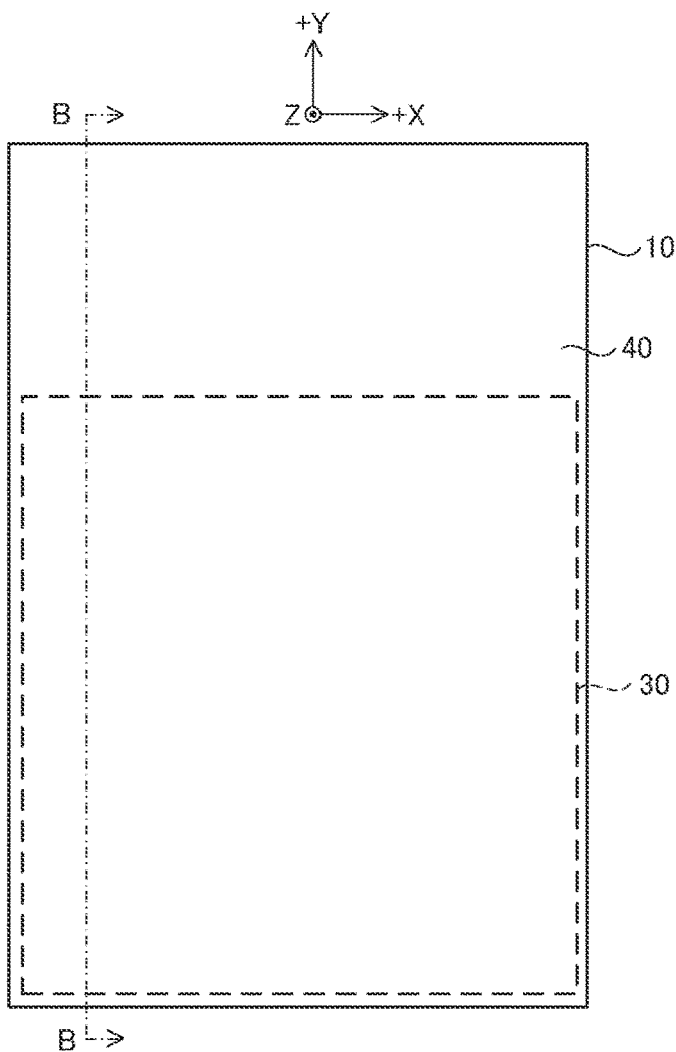
FIG. 6 is a top view illustrating the insulating layer and the thermoelectric conversion layer according to Embodiment 1.
Figure 7:
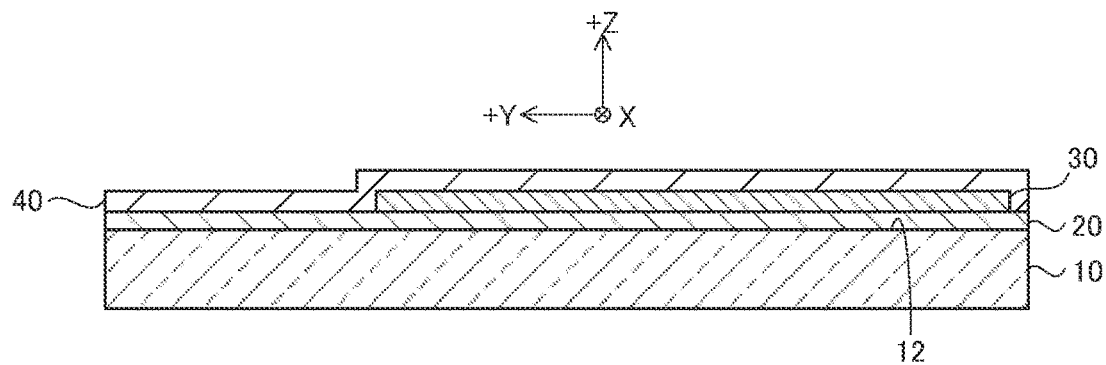
FIG. 7 is a cross-sectional view of the insulating layer and the thermoelectric conversion layer illustrated in FIG. 6, taken along line B-B.

In step S30, as illustrated in FIGS. 6 and 7, the insulating layer 40 is formed on the thermoelectric conversion layer 30 and on the base layer 20. Specifically, the insulating layer 40 is formed from silicon oxide by chemical vapor deposition (CVD), on the entire surface of the base layer 20 and the thermoelectric conversion layer 30. Here, the thermoelectric conversion layer 30 is covered by the insulating layer 40 such that the thermoelectric conversion layer 30 is not exposed from the insulating layer 40.

Figure 8:
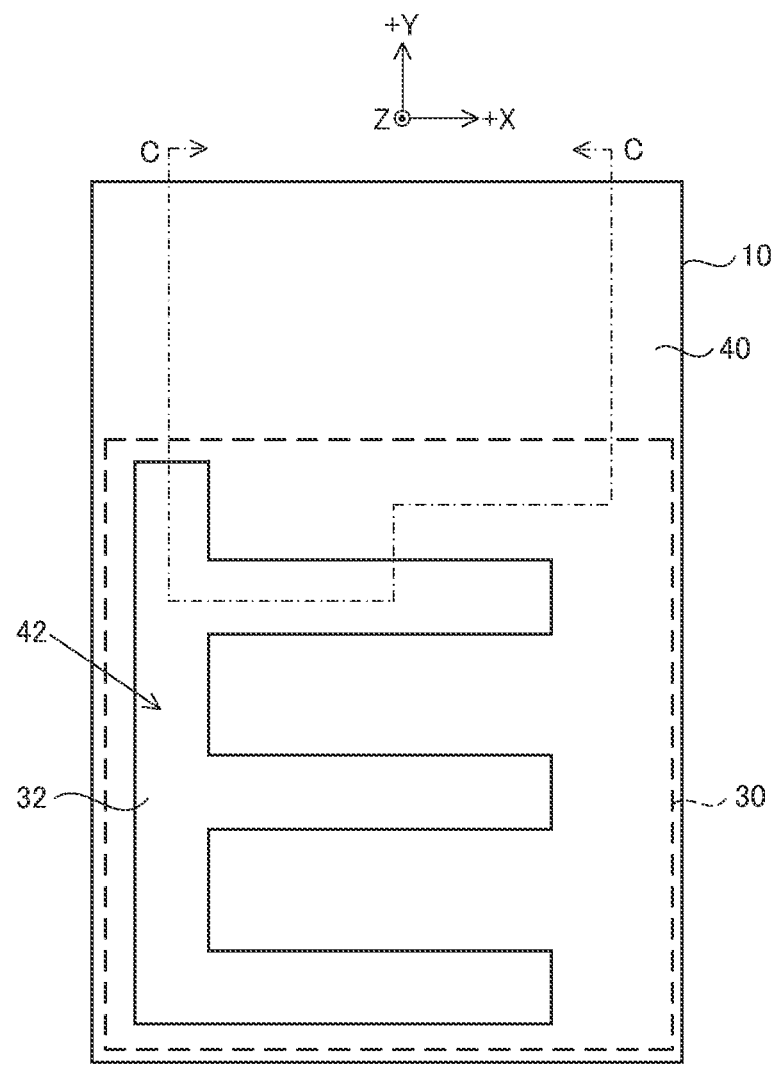
FIG. 8 is a top view illustrating a first contact hole of Embodiment 1.
Figure 9:
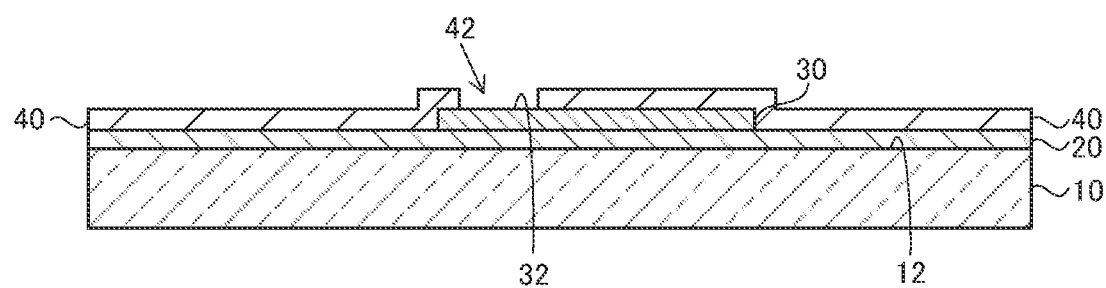
FIG. 9 is a cross-sectional view of the first contact hole illustrated in FIG. 8, taken along line C-C.

In step S40, the first contact hole 42 is formed in the insulating layer 40 by photolithography and etching. In Embodiment 1, as illustrated in FIGS. 8 and 9, the first contact hole 42 is formed in a comb teeth shape so as to match the shape of the first layer 52 of the first electrode 50. Due to this configuration, the first main surface 32 of the thermoelectric conversion layer 30 is exposed from the insulating layer 40 in a comb teeth shape.

Figure 10:
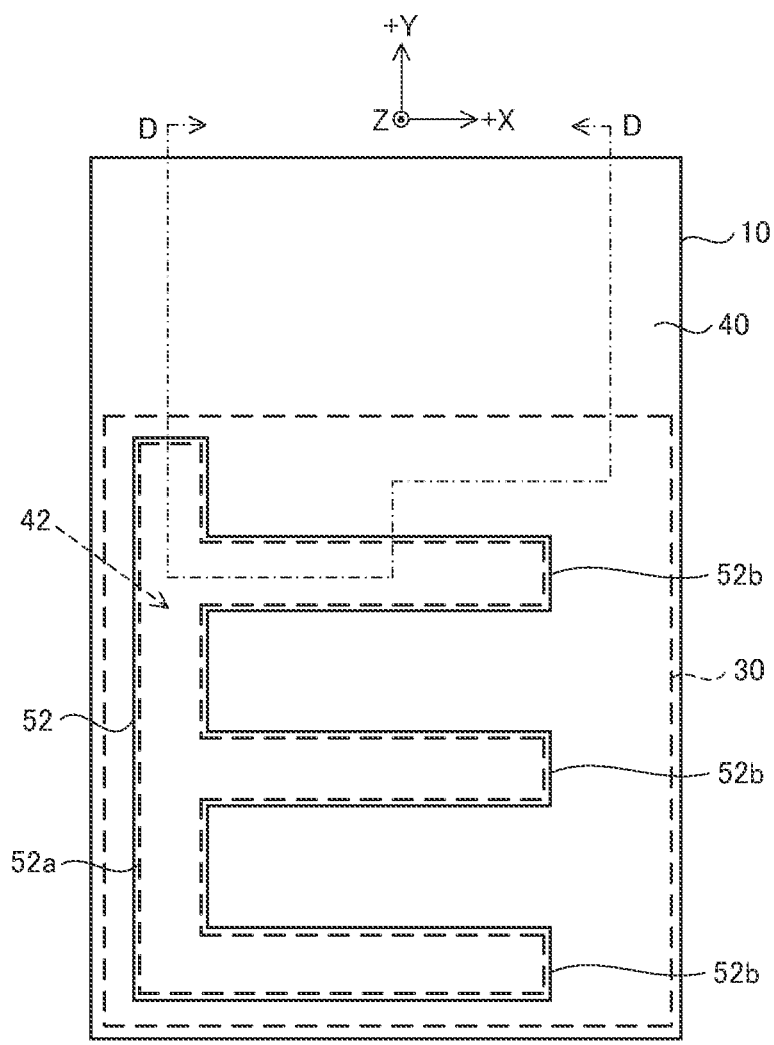
FIG. 10 is a top view illustrating a first layer of a first electrode according to Embodiment 1.
Figure 11:
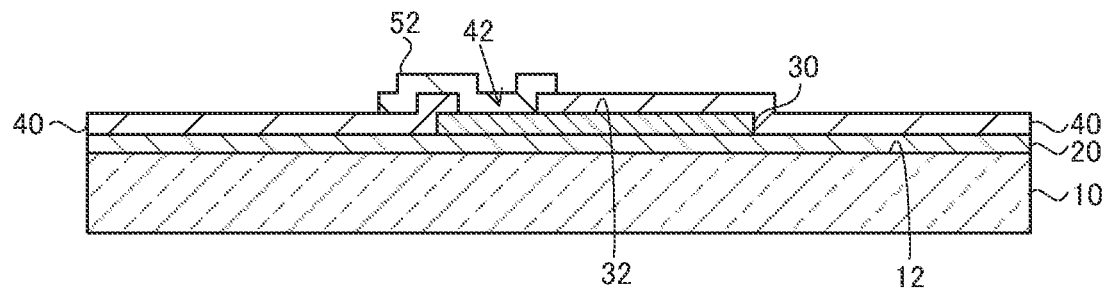
FIG. 11 is a cross-sectional view of the first layer of the first electrode illustrated in FIG. 10, taken along line D-D.

In step S50, as illustrated in FIGS. 10 and 11, the first layer 52 of the first electrode 50 is formed on the insulating layer 40. The first layer 52 connects to the first main surface 32 of the thermoelectric conversion layer 30 via the first contact hole 42. Additionally, the first layer 52 covers the opening of the first contact hole 42 such that the thermoelectric conversion layer 30, which is exposed from the insulating layer 40 at the bottom of the first contact hole 42, is not exposed from the first layer 52.

Figure 12:
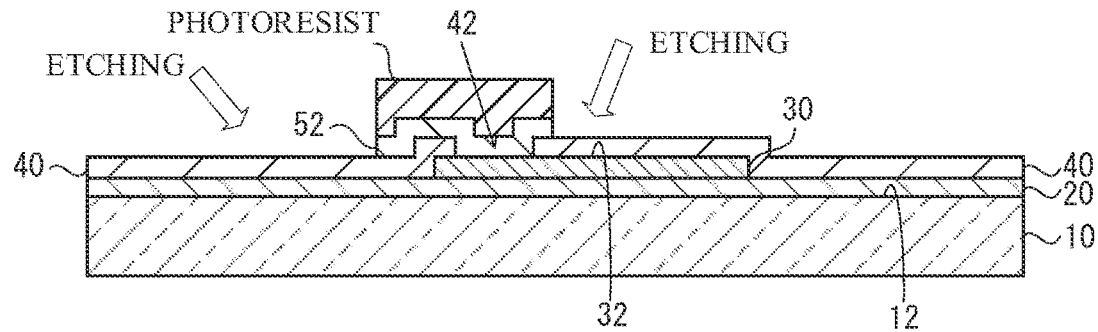
FIG. 12 is a schematic view for explaining the forming of the first layer of the first electrode according to Embodiment 1.
Figure 13:
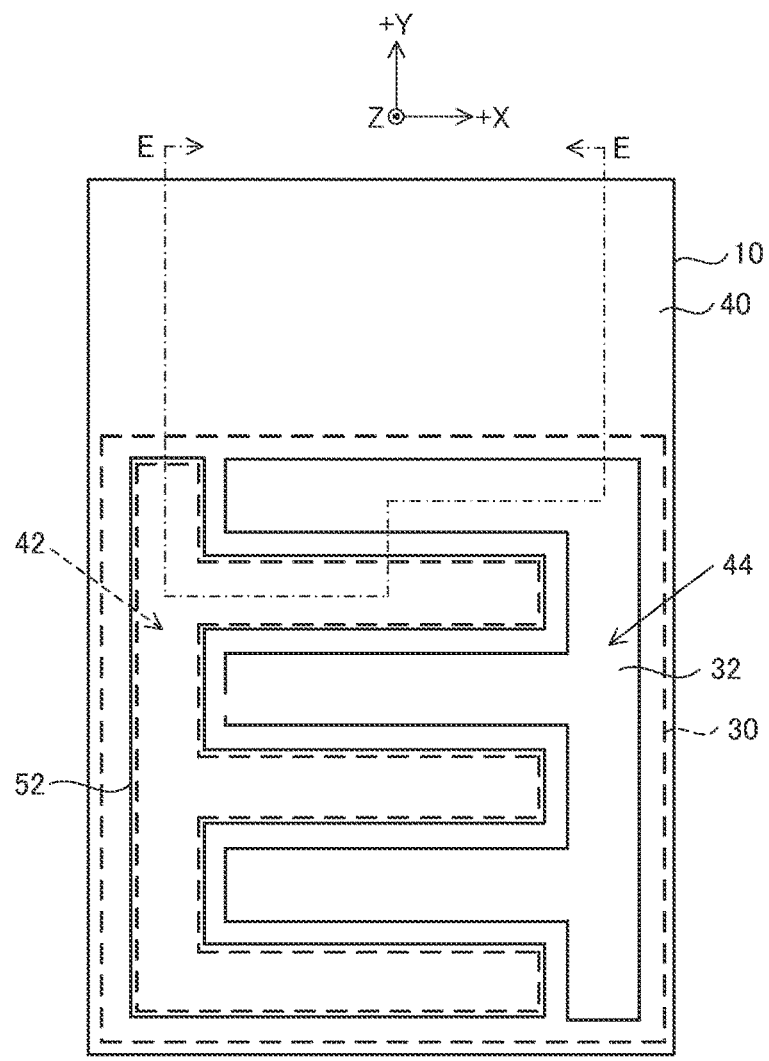
FIG. 13 is a top view illustrating a second contact hole according to Embodiment 1.
Figure 14:
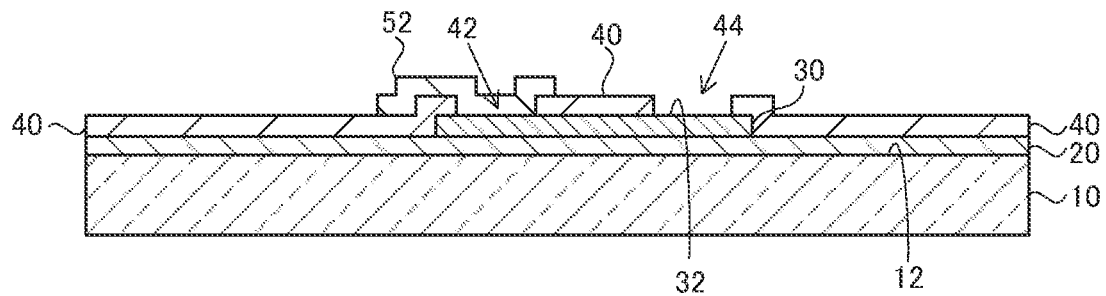
FIG. 14 is a cross-sectional view of the second contact hole illustrated in FIG. 13, taken along line E-E.

Specifically, firstly, the first contact hole 42 is filled in by sputtering to form a titanium thin film on the insulating layer 40. Next, the first layer 52 is formed in a comb teeth shape from the titanium thin film by photolithography and etching. In the embodiment, when etching the titanium thin film, as illustrated in FIG. 12, the thermoelectric conversion layer 30 is covered by the insulating layer 40 and the first layer 52 (the titanium thin film) and, furthermore, the location of the titanium thin film that becomes the first layer 52 of the first electrode 50 is covered by a photoresist. As such, the insulating layer 40 and the titanium thin film are exposed to the etching solution, and the first layer 52 can be formed without exposing the thermoelectric conversion layer 30 to the etching solution.

In step S60, the second contact hole 44 is formed in the insulating layer 40 by photolithography and etching. In Embodiment 1, as illustrated in and FIGS. 13 and 14, the second contact hole 44 is formed in a comb teeth shape so as to match the shape of the second electrode 60. Due to this configuration, the first main surface 32 of the thermoelectric conversion layer 30 is exposed from the insulating layer 40 in a comb teeth shape.

Figure 15:
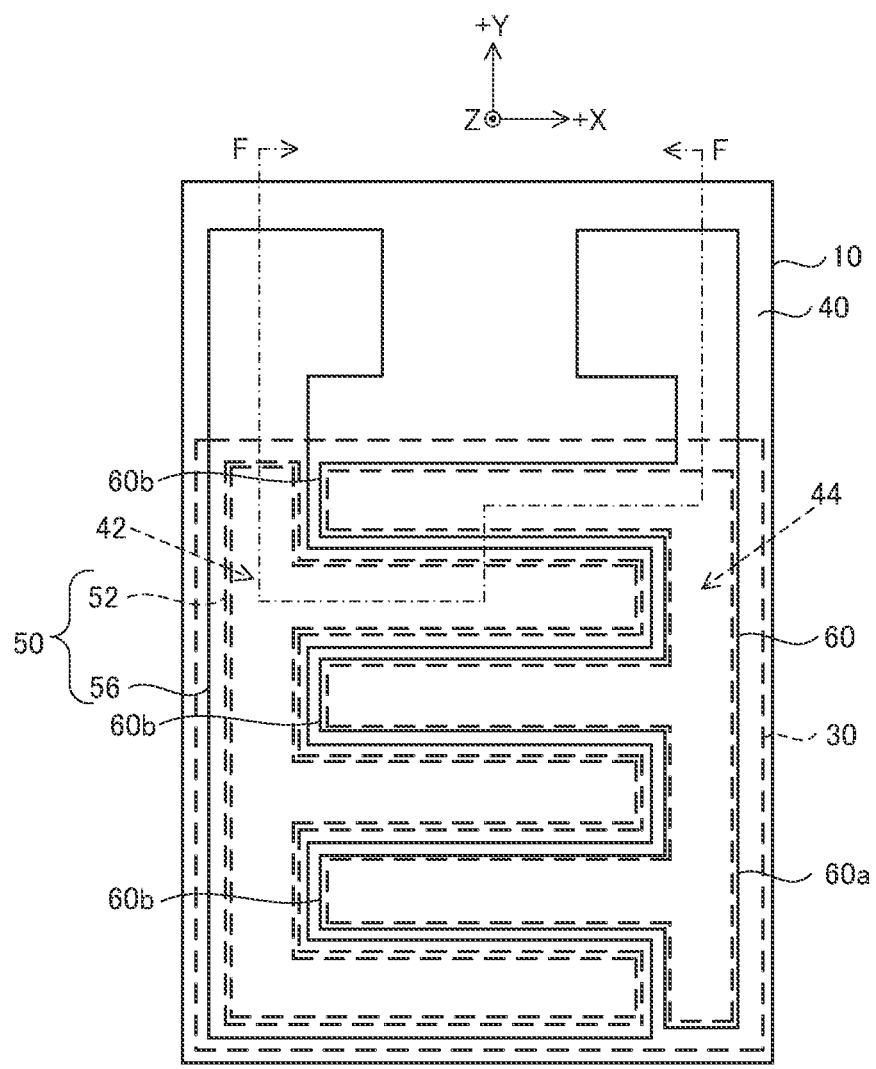
FIG. 15 is a top view illustrating a second electrode, and a second layer of the first electrode according to Embodiment 1.
Figure 16:
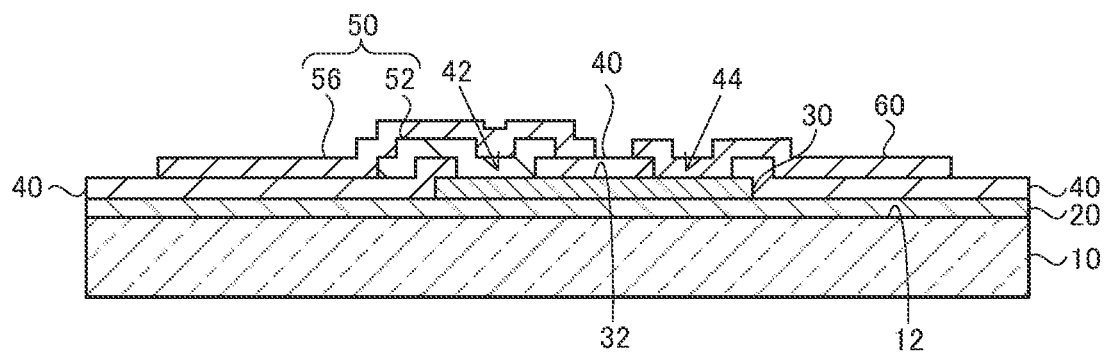
FIG. 16 is a cross-sectional view of the second electrode, and the second layer of the first electrode illustrated in FIG. 15, taken along line F-F.

In step S70, as illustrated in FIGS. 15 and 16, the second electrode 60, and the second layer 56 of the first electrode 50 are both formed on the insulating layer 40. The second electrode 60 connects to the first main surface 32 of the thermoelectric conversion layer 30 via the second contact hole 44. The second electrode 60 covers the opening of the second contact hole 44 such that the thermoelectric conversion layer 30, which is exposed from the insulating layer 40 at the bottom of the second contact hole 44, is not exposed from the second electrode 60. Additionally, the second layer 56 of the first electrode 50 covers the first layer 52 of the first electrode 50 such that the first layer 52 is not exposed from the second layer 56. The second electrode 60 and the second layer 56 are formed form a material (copper) that has a work function different from the work function of the material (titanium) forming the first layer 52 of the first electrode 50.

Figure 17:
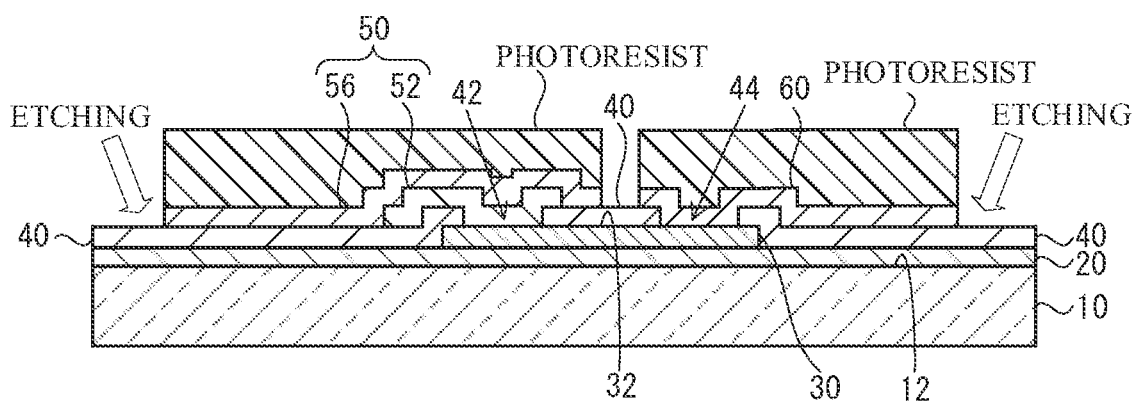
FIG. 17 is a schematic view for explaining the forming of the second electrode and the second layer of the first electrode according to Embodiment 1.

Specifically, firstly, the second contact hole 44 is filled in by sputtering to form a copper thin film on the insulating layer 40 and the first layer 52. Next, the second electrode 60 and the second layer 56 are each formed, from the copper thin film, in a comb teeth shape by photolithography and etching. In Embodiment 1, when etching the copper thin film, as illustrated in FIG. 17, the thermoelectric conversion layer 30 is covered by the insulating layer 40, the first layer 52, and the second electrode 60 (the titanium thin film), the first layer 52 is covered by the second layer 56 (the copper thin film) and, furthermore, the locations of the copper thin film that become the second layer 56 of the first electrode 50 and the second electrode 60 are covered by photoresists. As such, the insulating layer 40 and the copper thin film are exposed to the etching solution, and the second electrode 60 can be formed without exposing the thermoelectric conversion layer 30 and the first layer 52 to the etching solution.

In step S80, in one example, the protection layer 70 is formed from photosensitive polyimide. Specifically, the photosensitive polyimide is applied and, then, the applied photosensitive polyimide is exposed and developed. Then, the developed photosensitive polyimide is fired to form the protection layer 70. Thus, the thermoelectric conversion element 100 can be manufactured.

Thus, with the thermoelectric conversion element 100 of Embodiment 1, the first layer 52 of the first electrode 50 can be formed by etching without causing damage to the thermoelectric conversion layer 30 and the first layer 52 of the first electrode 50, and the second layer 56 of the first electrode 50 and the second electrode 60 can be formed without causing damage to the thermoelectric conversion layer 30, and the first layer 52 and the second layer 56 of the first electrode 50, and the second electrode 60. Accordingly, the thermoelectric conversion element 100 can easily be miniaturized by photolithography and etching. Furthermore, by miniaturizing the comb teeth shaped first electrode 50 (the first layer 52) and second electrode 60, the spacing between the first electrode 50 and the second electrode 60 can be narrowed and the perimeter length of the first electrode 50 and the second electrode 60 can be lengthened, and the short-circuit current of the thermoelectric conversion element 100 can be increased.

The characteristics of the thermoelectric conversion element 100 are determined by the work functions of the first electrode 50 and the second electrode 60. Specifically, the selection, based on the work function, of the material forming the first layer 52 of the first electrode 50 and the material forming the second layer 56 of the first electrode 50 and the second electrode 60 significantly affects the characteristics of the thermoelectric conversion element 100. However, in conventional thermoelectric conversion elements (for example, the thermoelectric conversion element described in Japanese Patent No. 6513476), when manufacturing the thermoelectric conversion element by photolithography and etching, the materials forming the electrodes must be selected in consideration of the work function and also the galvanic effects related to etching. In Embodiment 1, when forming the first layer 52 of the first electrode 50, and the second layer 56 of the first electrode 50 and the second electrode 60, only one of the materials (titanium or copper) forming the constituents is exposed and etched. As such, the material forming the first layer 52 of the first electrode 50 and the material forming the second layer 56 of the first electrode 50 and the second electrode 60 can be selected on the basis of the work function, without considering the galvanic effects related to etching. That is, the degree of freedom related to the selection of the material forming the first layer 52 of the first electrode 50 and the material forming the second layer 56 of the first electrode 50 and the second electrode 60 is enhanced, and the characteristics of the thermoelectric conversion element 100 can easily be enhanced.

In Embodiment 1, a configuration is described in which titanium is used as the material of the first layer 52 of the first electrode 50 and copper is used as the material of the second layer 56 of the first electrode 50 and the second electrode 60. However, the thermoelectric conversion element 100 can be manufactured under the same procedures even in a configuration in which the materials are exchanged and copper is used as the material of the first layer 52 of the first electrode 50, and titanium is used as the material of the second layer 56 of the first electrode 50 and the second electrode 60.

Embodiment 2

A configuration is possible in which the thermoelectric conversion element 100 is provided with a first electrode 50 that does not include the second layer 56. In other words, a configuration is possible in which the entirety of the first electrode 50 of the thermoelectric conversion element 100 is formed by using the material of the first layer 52.

Figure 18:
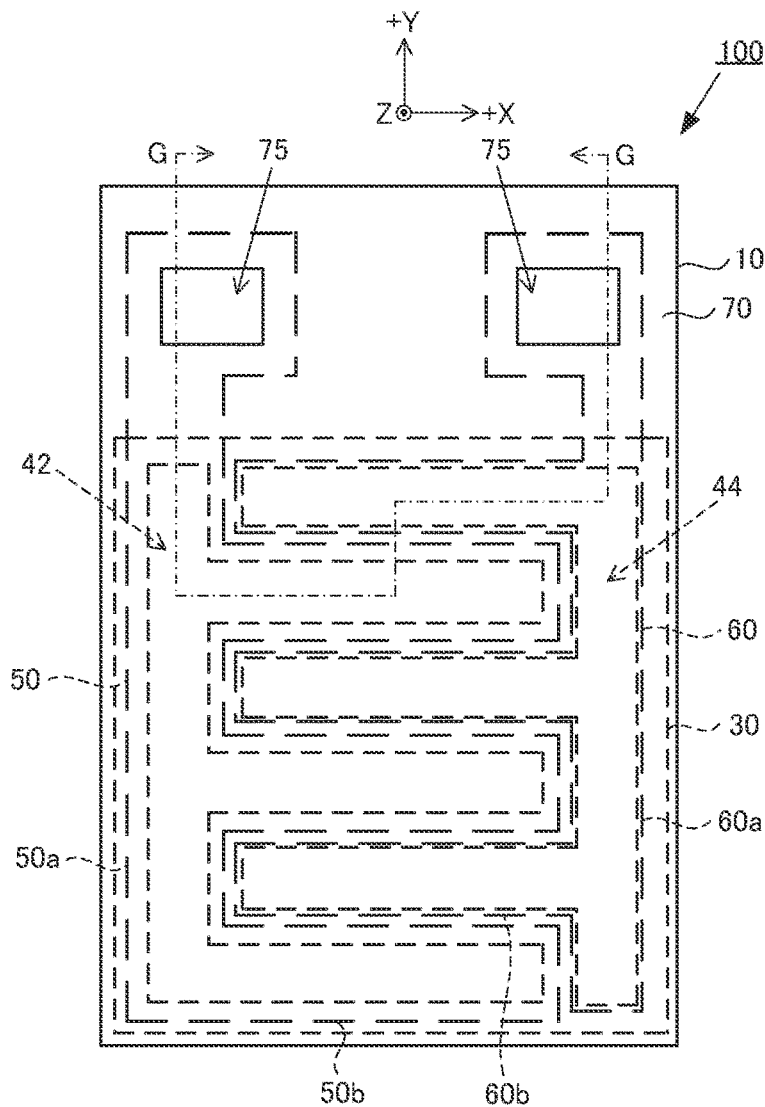
FIG. 18 is a top view illustrating a thermoelectric conversion element according to Embodiment 2.
Figure 19:
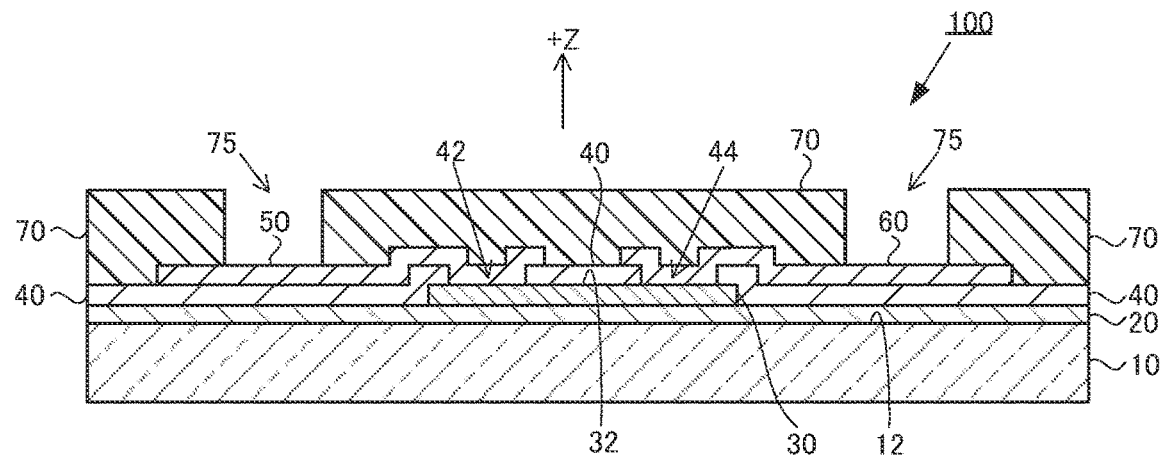
FIG. 19 is a cross-sectional view of the thermoelectric conversion element illustrated in FIG. 18, taken along line G-G.

In Embodiment 2, as illustrated in FIGS. 18 and 19, the thermoelectric conversion element 100 includes a substrate 10, base layer 20, a thermoelectric conversion layer 30, an insulating layer 40, a first electrode 50, a second electrode 60, and a protection layer 70. In this configuration, it is sufficient that the constituents other than the first electrode 50 are the same as in Embodiment 1. In FIG. 18, the +X direction, the +Y direction, and the +Z direction are set the same as in FIG. 1 of Embodiment 1.

The first electrode 50 that does not include the second layer 56 connects to the first main surface 32 of the thermoelectric conversion layer 30 via the first contact hole 42 of the insulating layer 40. The first electrode 50 covers the opening of the first contact hole 42 such that the thermoelectric conversion layer 30, which is exposed from the insulating layer 40 at the bottom of the first contact hole 42, is not exposed from the first electrode 50.

In Embodiment 2, the first electrode 50 illustrated in FIG. 18 includes a first base 50a extending in the Y direction and a plurality of first comb teeth 50b extending in the +X direction from the first base 50a. That is, the first electrode 50 is formed in a comb teeth shape. The first comb teeth 50b and second comb teeth 60b of the second electrode 60 are disposed facing each other in an alternating manner on the first main surface 32 of the thermoelectric conversion layer 30. As with the first layer 52 of Embodiment 1, in one example, an entirety of the first electrode 50 is formed from titanium (Ti) that has a small work function.

In Embodiment 2, the insulating layer 40 covers the thermoelectric conversion layer 30, and the first electrode 50 disposed on the insulating layer 40 connects to the first main surface 32 of the thermoelectric conversion layer 30 via the first contact hole 42 of the insulating layer 40. As such, when forming the first electrode 50 by etching, the thermoelectric conversion layer 30 is not exposed from the insulating layer 40 and is not exposed to the etching solution. Due to this, galvanic cells are not formed by the first electrode 50, the etching solution, and the thermoelectric conversion layer 30. As a result, with the thermoelectric conversion element 100, the first electrode 50 can be formed by etching without causing damage (for example, excessive dissolving) due to galvanic effects to the first electrode 50 and the thermoelectric conversion layer 30.

In Embodiment 2, when forming the second electrode 60 by etching, the first electrode is covered so as not to be exposed from the photoresist, and the first electrode 50 is not exposed to the etching solution. Due to this, galvanic cells are not formed by the second electrode 60, the etching solution, and the first electrode 50. As a result, with the thermoelectric conversion element 100, the second electrode 60 can be formed by etching without causing damage due to galvanic effects to the first electrode 50 and the second electrode 60. In one example, the second electrode 60 is formed from copper (Cu) that has a large work function.

In Embodiment 2, the thermoelectric conversion element 100 includes the first electrode 50 and the second electrode 60 that connect to the first main surface of the thermoelectric conversion layer 30. The work functions of the materials forming the first electrode 50 and the second electrode 60 differ. The thermoelectric conversion element 100 produces thermoelectromotive force due to the temperature difference in the thickness direction (the Z direction) of the thermoelectric conversion layer 30. With the thermoelectric conversion element 100, the thermoelectric conversion layer 30, and the first electrode 50, and the second electrode 60 are not damaged, even when the first electrode 50 is formed by etching, and the thermoelectric conversion layer 30, the first electrode 50, and the second electrode 60 are not damaged even when the second electrode 60 is formed by etching. Accordingly, the thermoelectric conversion element 100 can easily be miniaturized by photolithography and etching.

Figure 20:
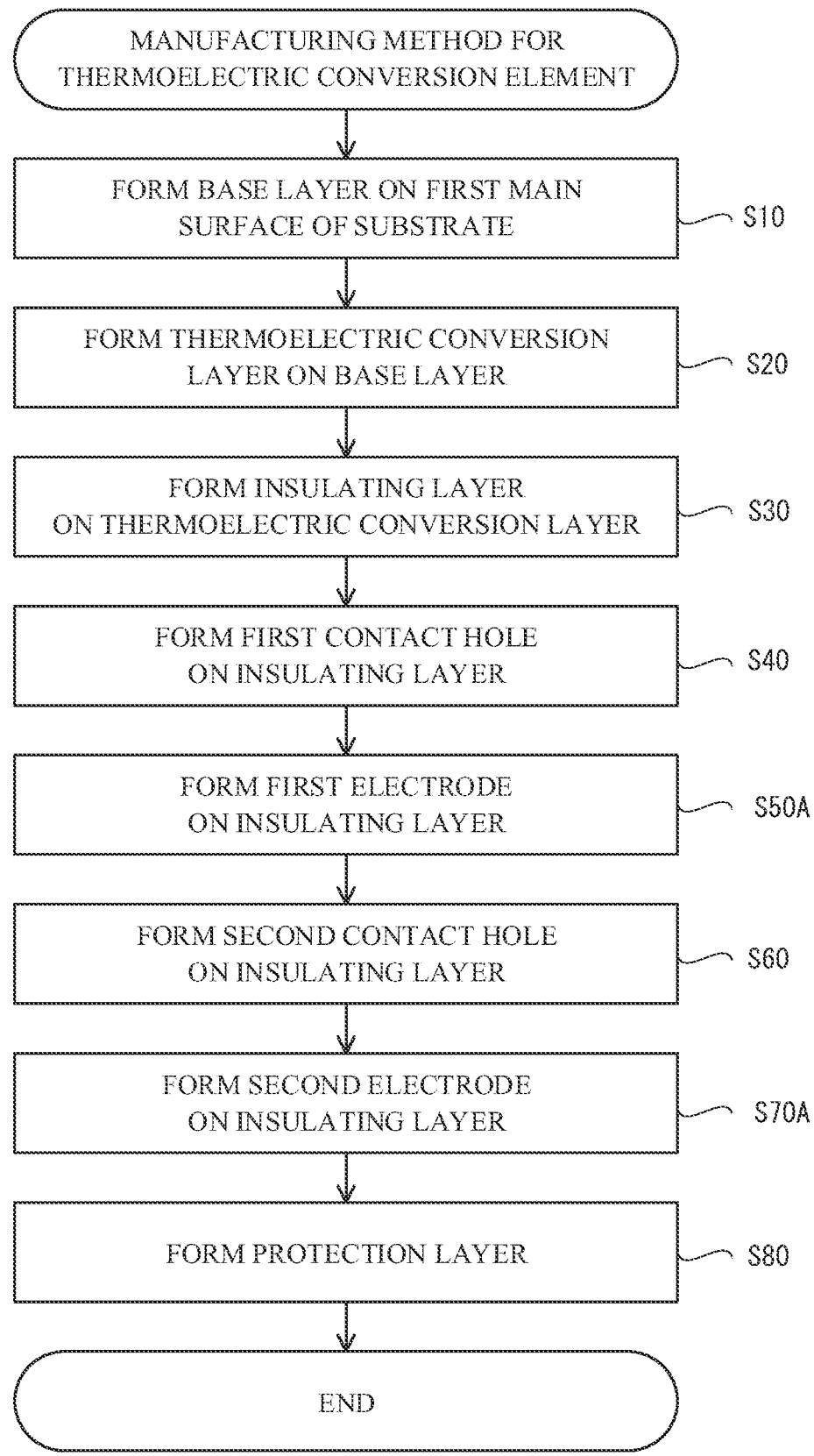
FIG. 20 is a flowchart illustrating a manufacturing method of the thermoelectric conversion element according to Embodiment 2.

Next, a manufacturing method for the thermoelectric conversion element 100 of Embodiment 2 is described while referencing FIGS. 20 to 25. FIG. 20 is a flowchart illustrating the manufacturing method for the thermoelectric conversion element 100 according to Embodiment 2. In Embodiment 2, it is sufficient that steps S10 to S40, S60, and S80 are the same as in Embodiment 1.

Figure 21:
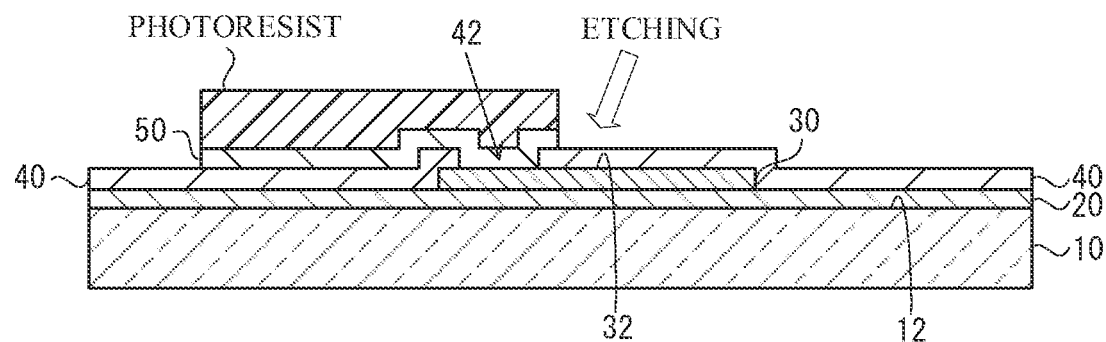
FIG. 21 is a schematic view for explaining the forming of a first electrode according to Embodiment 2.
Figure 22:
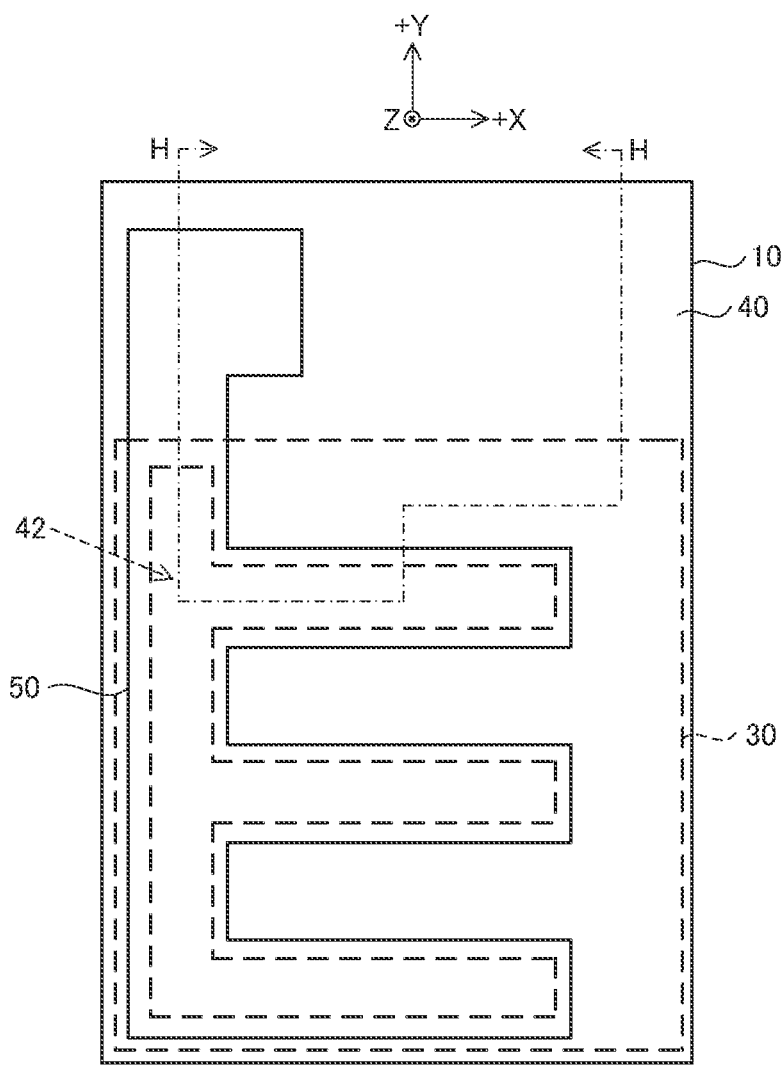
FIG. 22 is a top view illustrating the first electrode according to Embodiment 2.
Figure 23:
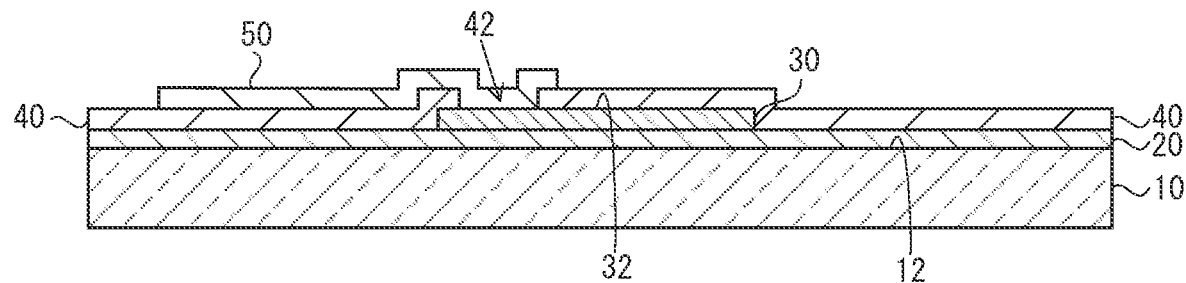
FIG. 23 is a cross-sectional view of the first electrode illustrated in FIG. 22, taken along line H-H.

After step S40, the manufacturing method illustrated in FIG. 20 includes a step of forming, on the insulating layer 40, the first electrode 50 that connects to the first main surface 32 of the thermoelectric conversion layer 30 via the first contact hole 42 (step S50A). Step 50A includes a procedure of forming a titanium thin film, the same as in step S50 of Embodiment 1. In step S50A, when etching the titanium thin film, a location different than in step S50 of Embodiment 1 is covered by a photoresist. FIG. 21 illustrates the first electrode 50 that is covered by a photoresist in step S50A. FIGS. 22 and 23 illustrate the first electrode 50 disposed on the insulating layer 40 in step S50A. The first electrode 50 connects to the first main surface 32 of the thermoelectric conversion layer 30 via the first contact hole 42. Additionally, the first electrode 50 covers the opening of the first contact hole 42 such that the thermoelectric conversion layer 30, which is exposed from the insulating layer 40 at the bottom of the first contact hole 42, is not exposed from the first electrode 50.

Figure 24:
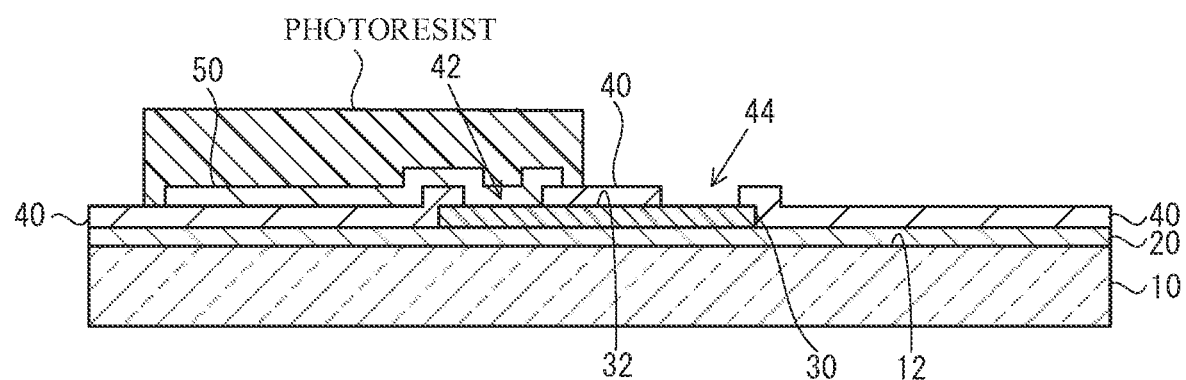
FIG. 24 is a schematic drawing illustrating a photoresist covering the first electrode according to Embodiment 2.
Figure 25:
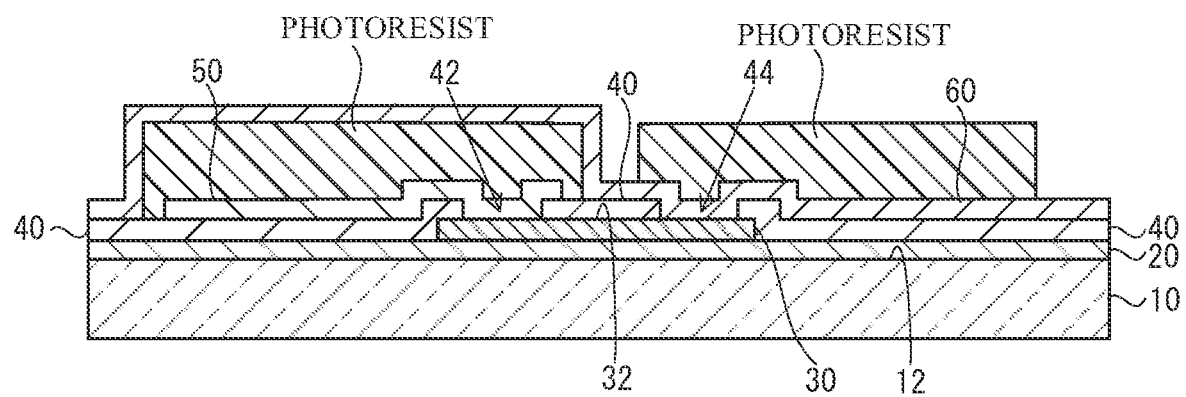
FIG. 25 is a schematic view illustrating a photoresist covering s second electrode according to Embodiment 2.
Figure 26:
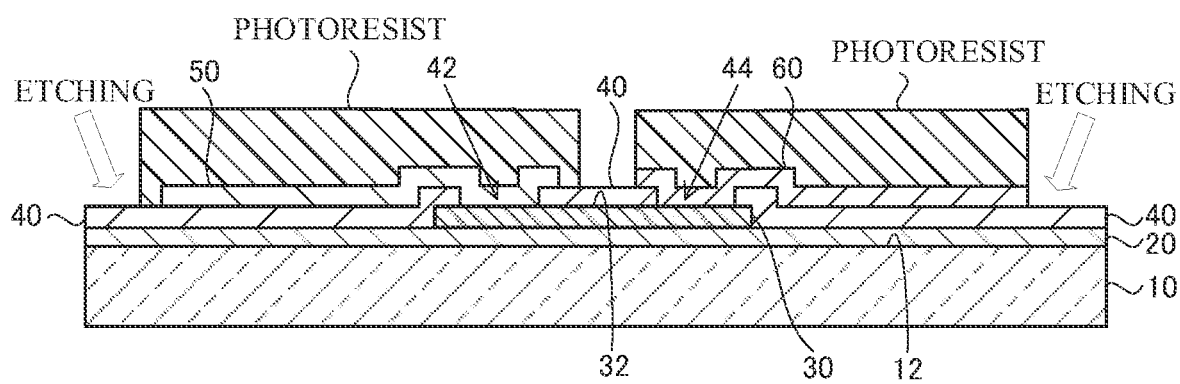
FIG. 26 is a schematic view for explaining the forming of the second electrode according to Embodiment 2.
Figure 27:
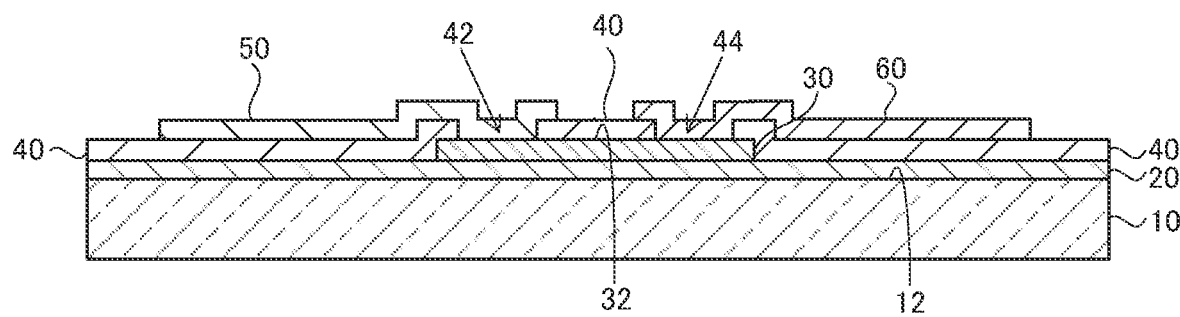
FIG. 27 is a cross-sectional view of after the first electrode and the second electrode according to Embodiment 2 are formed.

After step S60, the manufacturing method illustrated in FIG. 20 includes a step of forming, on the insulating layer 40, the second electrode 60 that connects to the first main surface 32 of the thermoelectric conversion layer 30 via the second contact hole 44 (step S70A). A material that has a work function different than the work function of the material forming the first electrode 50 is used to form the second electrode 60. Step S70A includes a procedure of filling in the second contact hole 44 by sputtering to form a copper thin film on the insulating layer 40. In this procedure, before forming the copper thin film, the first electrode 50 is covered by the photoresist so as not to be exposed. FIG. 24 illustrates the first electrode 50 covered by the photoresist. The photoresist covering the first electrode 50 may be the remains of the photoresist used when forming the second contact hole 55, or may be a photoresist that is disposed newly in correspondence with the forming of the second electrode 60. After the forming of the copper thin film, the location that becomes the second electrode 60 is covered by a photoresist, as illustrated in FIG. 25. Thereafter, the second electrode 60 is formed, from the copper thin film, in a comb teeth shape by the etching illustrated in FIG. 26. Examples of the etching solution include a mixed solution of phosphoric acid, nitric acid, and acetic acid. In this case, since the first electrode 50 is covered by the photoresist, the need to consider the etching selectivity of the second electrode 60 is eliminated. The thermoelectric conversion layer 30 is covered by the insulating layer 40, the first electrode 50, and the second electrode 60, and the locations that become the first electrode 50 and the second electrode 60 are covered by the photoresists. As such, the insulating layer 40 and the copper thin film are exposed to the etching solution, and the second electrode 60 can be formed without the thermoelectric conversion layer 30 and the first layer 52 being exposed to the etching solution. FIG. 27 illustrates the first electrode 50 and second electrode 60 disposed on the insulating layer 40.

In Embodiment 2, with the thermoelectric conversion element 100, the first electrode 50 can be formed without causing etching damage to the thermoelectric conversion layer 30 and the first electrode 50. In addition, with the thermoelectric conversion element 100, the second electrode 60 can be formed without causing etching damage to the thermoelectric conversion layer 30, the first electrode 50, and the second electrode 60. Accordingly, the thermoelectric conversion element 100 can easily be miniaturized by photolithography and etching. Furthermore, by miniaturizing the comb teeth shaped first electrode 50 and second electrode 60, the spacing between the first electrode 50 and the second electrode 60 can be narrowed and the perimeter length of the first electrode 50 and the second electrode 60 can be lengthened, and the short-circuit current of the thermoelectric conversion element 100 can be increased.

In Embodiment 2, when forming the first electrode 50 and the second electrode 60, only one of the materials (titanium or copper) forming the constituents is exposed and etched. As such, the material forming the first electrode 50 and the material forming the second electrode 60 can be selected on the basis of the work function, without considering the galvanic effects related to etching. That is, the degree of freedom related to the selection of the material forming the first electrode 50 and the material forming the second electrode 60 is enhanced, and the characteristics of the thermoelectric conversion element 100 can easily be enhanced.

In Embodiment 2, a configuration is described in which titanium is used as the material of the first electrode 50 and copper is used as the material of the second electrode 60. However, the thermoelectric conversion element 100 can be manufactured under the same procedures even in a configuration in which the materials are exchanged and copper is used as the material of the first electrode 50, and titanium is used as the material of the second electrode 60.

A configuration is possible in which the first electrode 50 and the second electrode 60 are formed by selective etching. Provided that a combination of electrode materials whereby a sufficient selection ratio with respect to the material of the first electrode 50 can be ensured when forming the second electrode 60 by etching, and selection of the etchant are possible, the thermoelectric conversion element 100 having the structure illustrated in FIGS. 18 and 19 can be manufactured without using the photoresist illustrated in FIG. 24. As a first example, when forming the first electrode 50 using titanium as the material, dry etching may be performed using a mixed gas containing boron trichloride ($BCl_3$) and chlorine ($Cl_2$). Thereafter, when forming the second electrode 60 using copper as the material, wet etching may be performed using a mixed solution containing sulfuric acid and hydrogen peroxide. When forming the second electrode 60, wet etching may be performed using a mixed solution containing phosphoric acid, nitric acid, and acetic acid. As a second example, when forming the first electrode 50 using copper as the material, wet etching may be performed using a mixed solution containing sulfuric acid ($H_2SO_4$) and hydrogen peroxide ($H_2O_2$). Thereafter, when forming the second electrode 60 using titanium as the material, wet etching using an acidic ammonium fluoride aqueous solution may be performed. In this example, silicon nitride (SiN) may be used instead of silicon oxide ($SiO_x$) as the material of the insulating layer 40.

A configuration is possible in which the thermoelectric conversion element 100 includes the first electrode of Embodiment 1 and, as such, the work functions of the materials of a portion of the first electrode 50 and the second electrode 60 differ. Alternatively, a configuration is possible in which the thermoelectric conversion element 100 includes the first electrode 50 of Embodiment 2 and, as such, the work functions of the materials of the entire first electrode 50 and the second electrode 60 differ. Accordingly, the thermoelectric conversion element 100 includes the first electrode 50, of which at least a portion is formed using a material that has a work function that is different from the work function of the material forming the second electrode 60.

Modified Examples

Embodiments have been described, but various modifications can be made to the present disclosure without departing from the spirit and scope of the present disclosure.

For example, the substrate 10 is not limited to a glass substrate. A configuration is possible in which the substrate 10 is formed from a film that has insulating properties (for example, a polyimide film).

The thermoelectric conversion element 100 of the embodiments includes the base layer 20, but a configuration is possible in which the thermoelectric conversion element 100 does not include the base layer 20. The thermoelectric conversion layer 30 may be formed directly on the first main surface 12 of the substrate 10. Furthermore, a configuration is possible in which the thermoelectric conversion element 100 does not include the protection layer 70.

In Embodiment 1, the first layer 52 of the first electrode 50 is formed from a material that has a small work function, and the second layer 56 of the first electrode 50 and the second electrode 60 are formed from a material that has a large work function. However, with the thermoelectric conversion element 100, it is sufficient that the work function of the material forming the first layer 52 of the first electrode 50 and the work function of the material forming the second layer 56 of the first electrode 50 and the second electrode 60 are different. In Embodiment 2, with the thermoelectric conversion element 100, it is sufficient that the work function of the material forming the entirety of the first electrode 50 and the work function of the material forming the second electrode 60 are different.

In Embodiment 1, for the materials forming the first layer 52 of the first electrode 50, and the second layer 56 of the first electrode 50 and the second electrode 60, examples of the material that has a small work function include cesium (Cs), aluminum (Al), and the like, and examples of the material that has a large work function include nickel (Ni). This is the same for the materials forming the first electrode 50 and the second electrode 60 in Embodiment 2.

A configuration is possible in which a protective plating is applied to the surfaces of the first electrode 50 (the second layer 56) and the second electrode 60 that are exposed through the terminal openings 75 of the protection layer 70.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

What is claimed is:

1. A thermoelectric conversion element, comprising:
a substrate;
a thermoelectric conversion layer disposed on a main surface of the substrate;
an insulating layer covering the thermoelectric conversion layer;
a first electrode disposed on the insulating layer and connecting to a main surface of the thermoelectric conversion layer via a first contact hole of the insulating layer; and
a second electrode disposed on the insulating layer and connecting to the main surface of the thermoelectric conversion layer via a second contact hole of the insulating layer, wherein
at least a portion of the first electrode is formed from a material that has a work function that is different from a work function of a material forming the second electrode.

2. The thermoelectric conversion element according to claim 1, wherein
the first electrode includes a first layer and a second layer,
the first layer connects to the main surface of the thermoelectric conversion layer,
the second layer covers the first layer such that the first layer is not exposed from the second layer, and
the second layer and the second electrode are formed from an identical material that has a work function that is different from the work function of the material forming the first layer.

3. The thermoelectric conversion element according to claim 2, wherein
the first layer covers an opening of the first contact hole such that the thermoelectric conversion layer is not exposed from the insulating layer, and
the second electrode covers an opening of the second contact hole such that the thermoelectric conversion layer is not exposed from the insulating layer.

4. The thermoelectric conversion element according to claim 2, wherein
the first layer includes a first base and a plurality of first comb teeth extending from the first base,
the second electrode includes a second base and a plurality of second comb teeth extending from the second base, and
the first comb teeth and the second comb teeth are arranged facing each other in an alternating manner on the main surface of the thermoelectric conversion layer.

5. The thermoelectric conversion element according to claim 1, wherein an entirety of the first electrode is formed from a material that has a work function that is different from a work function of a material forming the second electrode.

6. The thermoelectric conversion element according to claim 5, wherein
the first electrode covers an opening of the first contact hole such that the thermoelectric conversion layer is not exposed from the insulating layer, and
the second electrode covers an opening of the second contact hole such that the thermoelectric conversion layer is not exposed from the insulating layer.

7. The thermoelectric conversion element according to claim 5, wherein
the first electrode includes a first base and a plurality of first comb teeth extending from the first base, the second electrode includes a second base and a plurality of second comb teeth extending from the second base, and the first comb teeth and the second comb teeth are arranged facing each other in an alternating manner on the main surface of the thermoelectric conversion layer.

8. A manufacturing method for a thermoelectric conversion element, the manufacturing method comprising:

forming a thermoelectric conversion layer on a substrate;

forming an insulating layer on the thermoelectric conversion layer;

forming, in the insulating layer, a first contact hole that exposes a main surface of the thermoelectric conversion layer;

forming, on the insulating layer, a first electrode that connects to the main surface of the thermoelectric conversion layer via the first contact hole;

forming, in the insulating layer on which the first electrode is formed, a second contact hole that exposes the main surface of the thermoelectric conversion layer; and forming, on the insulating layer, a second electrode that connects to the main surface of the thermoelectric conversion layer via the second contact hole, from a material that has a work function that is different from a work function of a material forming at least a portion of the first electrode.

9. The manufacturing method according to claim 8, wherein:

the forming of the first electrode includes forming a first layer of the first electrode, and the forming of the second electrode includes forming a second layer of the first electrode that covers the first layer of the first electrode such that the first layer is not exposed from the second layer, the second layer being formed from a material identical to the material forming the second electrode.

10. The manufacturing method according to claim 8, wherein:

the first electrode covers an opening of the first contact hole such that the thermoelectric conversion layer is not exposed from the insulating layer, and the second electrode covers an opening of the second contact hole such that the thermoelectric conversion layer is not exposed from the insulating layer.

* * * * *